United States Patent
Shiota (10) Patent No.: US 8,564,128 B2
(45) Date of Patent: Oct. 22, 2013

(54) SEMICONDUCTOR DEVICE AND MANUFACTURING METHOD OF THE SAME

(75) Inventor: Junji Shiota, Hamura (JP)

(73) Assignee: Teramikros, Inc., Tokyo (JP)

( * ) Notice: Subject to any disclaimer, the term of this patent is extended or adjusted under 35 U.S.C. 154(b) by 113 days.

(21) Appl. No.: 13/225,693

(22) Filed: Sep. 6, 2011

(65) Prior Publication Data
US 2012/0074564 A1 Mar. 29, 2012

(30) Foreign Application Priority Data
Sep. 28, 2010 (JP) .................... 2010-216881

(51) Int. Cl.
*H01L 23/48* (2006.01)
(52) U.S. Cl.
USPC ............ 257/737; 257/E23.068; 257/E21.508; 438/127
(58) Field of Classification Search
USPC ............ 257/737, E23.068, E21.508; 438/127
See application file for complete search history.

(56) References Cited

U.S. PATENT DOCUMENTS 7,220,657 B2 * 5/2007 Ihara et al. .................... 438/466
2011/0037145 A1 * 2/2011 Lee et al. ...................... 257/532

FOREIGN PATENT DOCUMENTS

JP 2008-218731 A 9/2008

* cited by examiner

*Primary Examiner* — David Vu
*Assistant Examiner* — Brandon Fox
(74) *Attorney, Agent, or Firm* — Holtz, Holtz, Goodman & Chick, PC (57) ABSTRACT

A semiconductor device comprises a semiconductor substrate having a connection pad, an external connection electrode provided on the semiconductor substrate to be connected to the connection pad, and a sealing film provided to cover the external connection electrode, wherein an opening is provided in the sealing film to expose a center of the upper surface of the external connection electrode, and the sealing film is provided to cover an outer peripheral part of the upper surface of the external connection electrode.

14 Claims, 14 Drawing Sheets

SEMICONDUCTOR DEVICE AND MANUFACTURING METHOD OF THE SAME

CROSS-REFERENCE TO RELATED APPLICATIONS

This application is based upon and claims the benefit of priority from prior Japanese Patent Application No. 2010-216881, filed Sep. 28, 2010, the entire contents of which are incorporated herein by reference.

BACKGROUND OF THE INVENTION

1. Field of the Invention

The present invention relates to a semiconductor device and a manufacturing method of the same.

2. Description of the Related Art

What is called a chip size package (CSP) is known as a conventional semiconductor device, as described in, for example, Jpn. Pat. Appln. KOKAI Publication No. 2008-218731. This semiconductor device comprises a semiconductor substrate. A wiring line is provided on the upper surface of an insulating film which is provided on the semiconductor substrate. An external connection electrode is provided on the upper surface of a land of the wiring line. A sealing film is provided on the upper surface of the insulating film including the wiring line around the external connection electrode. A solder bump is provided on the upper surface of the external connection electrode.

According to a method of manufacturing the above-mentioned conventional semiconductor device, after the wiring line and the external connection electrode are formed, the sealing film made of an epoxy resin is formed on the upper surface of the insulating film including the wiring line and the external connection electrode so that the thickness of the sealing film is slightly greater than the height of the external connection electrode. Therefore, in this condition, the upper surface of the external connection electrode is covered with the sealing film. The upper side of the sealing film and the upper part of the external connection electrode are then grounded to expose the upper surface of the external connection electrode. The solder bump is then formed on the exposed upper surface of the external connection electrode.

Although not described in Jpn. Pat. Appln. KOKAI Publication No. 2008-218731, a grind stone is used to grind (scrape off little by little) the upper side of the sealing film and the upper part of the external connection electrode. Therefore, burrs are generated in the upper surface of the external connection electrode which has been ground and thereby torn, and burrs are formed in the upper surface of the sealing film stretching from the upper surface of the external connection electrode to its peripheral part. Accordingly, in general, as an after-treatment, the burrs formed in the upper surface of the sealing film stretching from the upper surface of the external connection electrode to its peripheral part are often removed by wet etching using an etching solution based on sulphuric acid.

However, if the burrs formed in the upper surface of the sealing film stretching from the upper surface of the external connection electrode to its peripheral part are removed, unnecessary dents are formed in the upper surface of the sealing film around the external connection electrode accordingly. Moreover, the height of the external connection electrode is unnecessarily reduced by overetching, and the etching solution infiltrates into a space between the external connection electrode and the sealing film. As a result, the upper peripheral part of the external connection electrode is unnecessarily etched and thinned, which causes a problem of a decreased quality of close contact between the external connection electrode and the sealing film. According to an embedded wafer level package (EWLP) which is a technique that directly embeds a wafer level package (WLP) into a printed wiring board, an opening is provided in an upper insulating film on the external connection electrode after the WLP is embedded, and the external connection electrode is thereby electrically connected to an upper wiring line. However, as the external connection electrode is in contact with both the surrounding sealing film and the upper insulating film on the peripheral edge of the opening, there is also a problem of a decreased quality of close contact in the vicinity of the border between the layers.

BRIEF SUMMARY OF THE INVENTION

A semiconductor device according to the present invention comprises:

a semiconductor substrate having a connection pad;

an external connection electrode provided on the semiconductor substrate to be connected to the connection pad; and a sealing film provided to cover the external connection electrode, wherein an opening is provided in the sealing film to expose a center of the upper surface of the external connection electrode, and the sealing film is provided to cover an outer peripheral part of the upper surface of the external connection electrode.

A semiconductor device manufacturing method according to the present invention comprises:

forming a sealing film to cover a peripheral side surface and an upper surface of an external connection electrode which is formed on a semiconductor substrate to be connected to a connection pad of the semiconductor substrate; and forming an opening in the sealing film, wherein the opening is formed in the sealing film so that the opening exposes a center of the upper surface of the external connection electrode and so that the sealing film covers an outer peripheral part of the upper surface of the external connection electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be explained with reference to the drawings.

Figure 1:
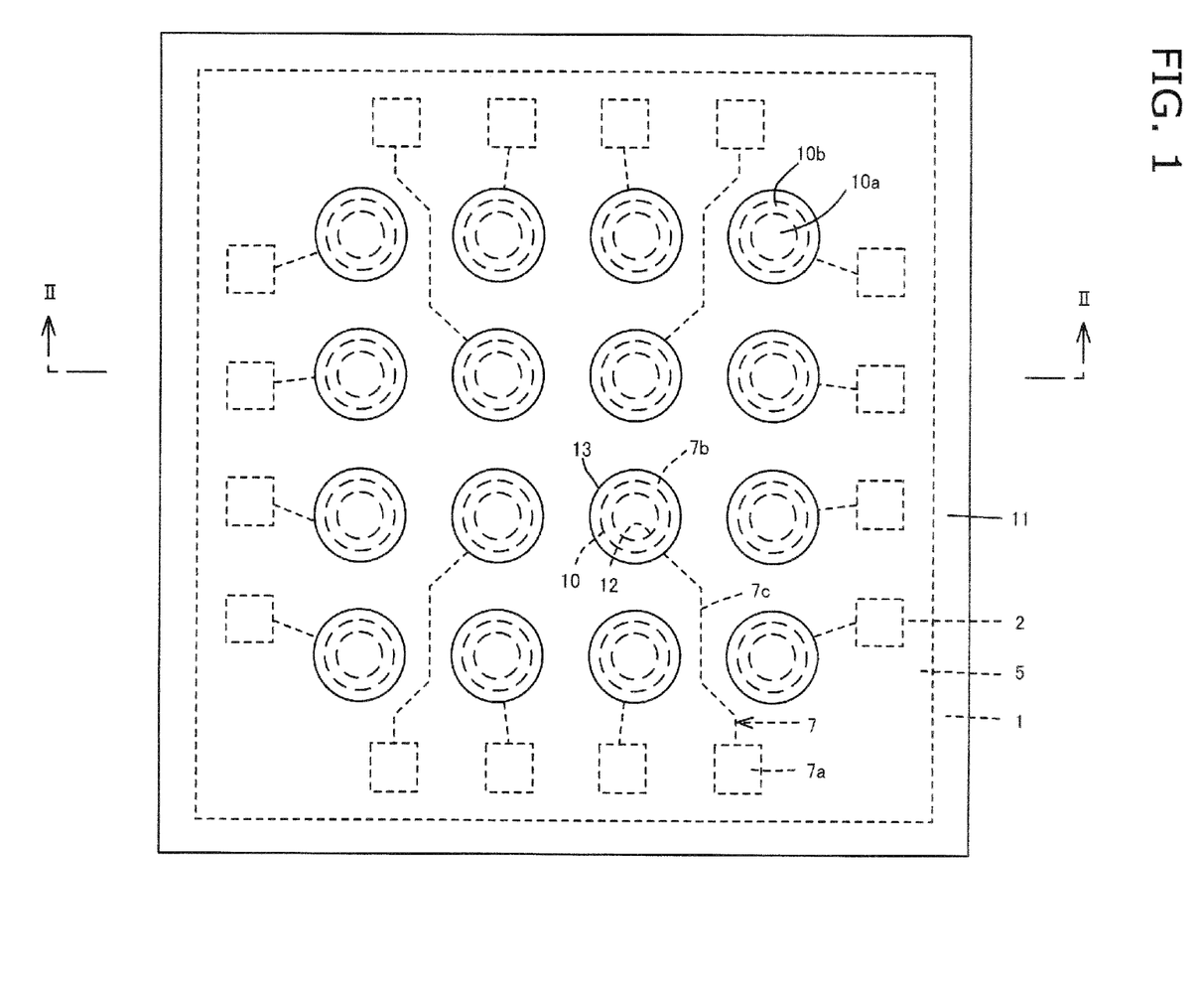
FIG. 1 is a plan view of a semiconductor device according to one embodiment of this invention.
Figure 2:
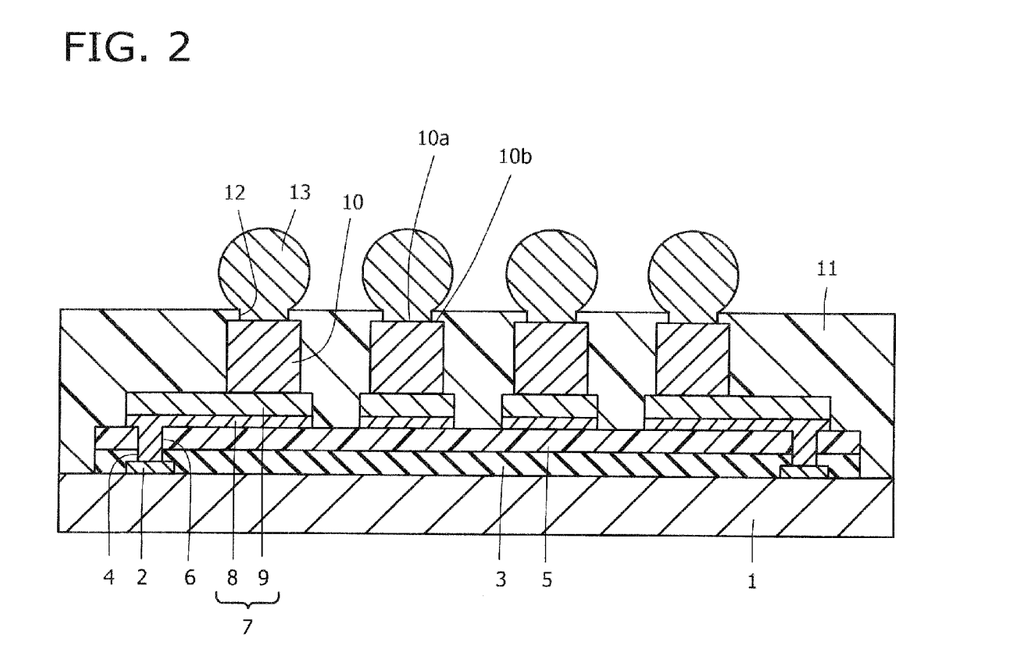
FIG. 2 is a sectional view of a part substantially taken along the II-II line of FIG. 1.

FIG. 1 shows a plan view of a semiconductor device according to one embodiment of this invention. FIG. 2 shows a sectional view of a part substantially taken along the II-II line of FIG. 1. This semiconductor device is generally called a CSP, and comprises a silicon substrate (semiconductor substrate) 1. Although not shown, elements that constitute an integrated circuit having a predetermined function, such as a transistor, a diode, a resistor, and condenser are formed on the upper surface of the silicon substrate 1. Connection pads 2 made of, for example, an aluminum-based metal and connected to the elements of the integrated circuit are provided in the peripheral part of the upper surface of the silicon substrate 1.

A passivation film (insulating film) 3 made of, for example, silicon oxide or silicon nitride is provided on the upper surface of the silicon substrate 1 except for the peripheral part of the silicon substrate 1 and the centers of the connection pads 2. The center of the connection pad 2 is exposed via an opening 4 provided in the passivation film 3. A protective film (insulating film) 5 made of, for example, a polyimide resin is provided on the upper surface of the passivation film 3. An opening 6 is provided in a part of the protective film 5 corresponding to the opening 4 of the passivation film 3.

Wiring lines 7 are provided on the upper surface of the protective film 5. The wiring line 7 has a two-layer structure composed of a foundation metal layer 8 made of, for example, copper and provided on the upper surface of the protective film 5, and an upper metal layer 9 made of copper and provided on the upper surface of the foundation metal layer 8. One end 7a of the wiring line 7 is connected to the connection pad via the openings 4 and 6 of the passivation film 3 and the protective film 5. The other end of the wiring line 7 is a land 7b. An extension line 7c intervenes between the end 7a and the land 7b. A columnar external connection electrode 10 made of copper is provided on the upper surface of the land 7b of the wiring line 7.

A sealing film 11 in the form of a single film made of, for example, an epoxy resin containing a silica filler is provided on the upper surface of the protective film 5 including the wiring line 7 around the external connection electrode 10 so that the upper surface of this sealing film 11 is flat. In this case, the outer peripheral part of the upper surface of the external connection electrode 10 is covered with the sealing film 11, and an opening 12 is provided in a part of the sealing film 11 corresponding to the center of the upper surface of the external connection electrode 10. The opening 12 is provided to expose an upper surface center 10a of the external connection electrode 10. The sealing film 11 is provided to cover an upper surface peripheral part 10b of the external connection electrode 10. A solder bump is provided in and above the opening 12 of the sealing film 11 so that this solder bump is connected to the upper surface center 10a of the external connection electrode 10. The upper surface of the external connection electrode 10 comprises the upper surface center 10a and the upper surface peripheral part 10b. The upper surface center 10a is a region including the center of the upper surface of the external connection electrode 10. The upper surface peripheral part 10b is a region including the whole outer peripheral edge of the upper surface of the external connection electrode 10. The opening 12 of the sealing film 11 and the upper surface of the external connection electrode 10 are substantially circular. The diameter of the opening 12 of the sealing film 11 is smaller than the diameter of the upper surface of the external connection electrode 10 by 10 μm or less, for example, several μm to 10 μm. The thickness of the sealing film 11 in the remaining part of the region 10b that covers the upper surface of the external connection electrode 10 is 10 μm or less.

Figure 3:
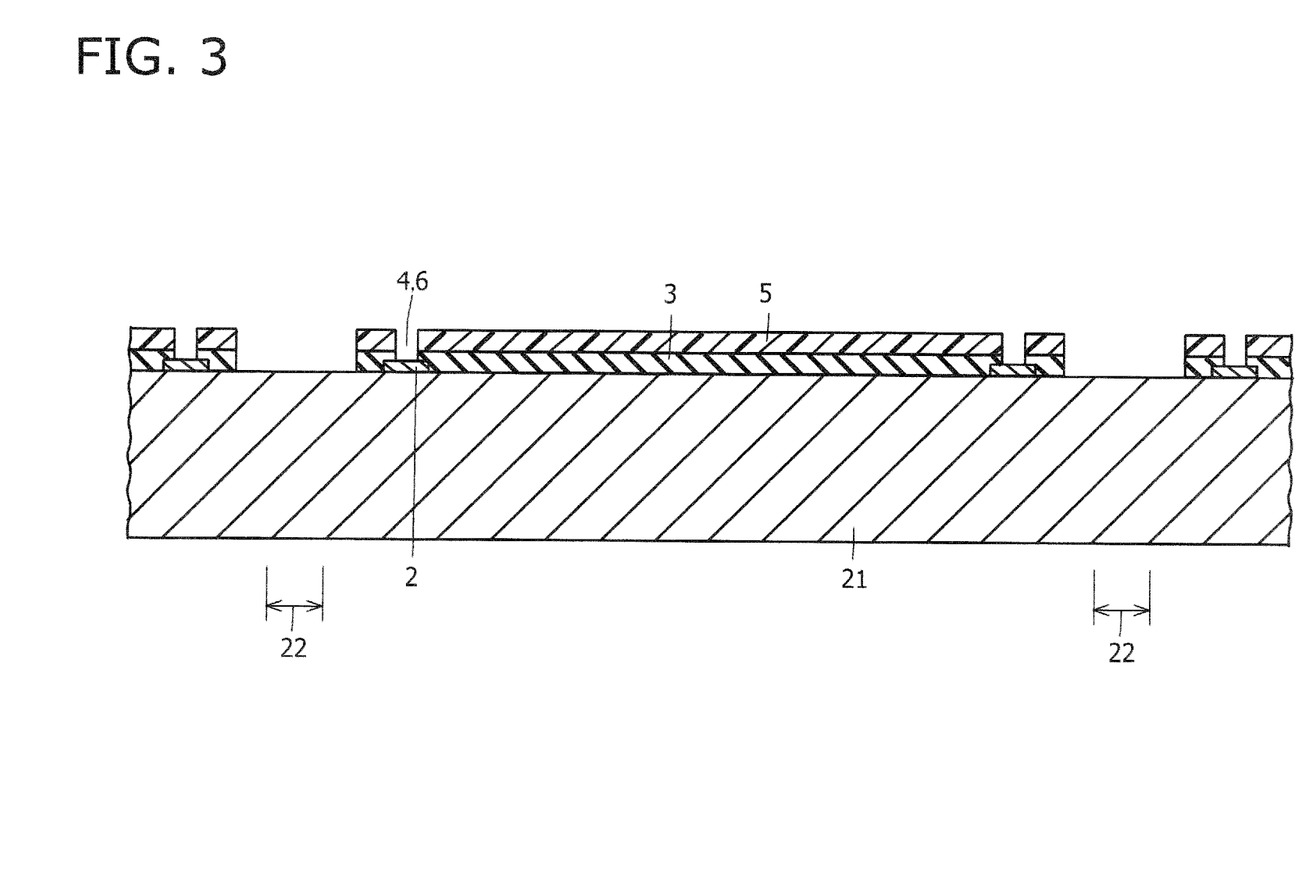
FIG. 3 is a sectional view of an initially prepared assembly in one example of a method of manufacturing the semiconductor device shown in FIG. 1 and FIG. 2.

Now, one example of a method of manufacturing this semiconductor device is described. First, as shown in FIG. 3, an assembly is prepared. In this assembly, a connection pad 2 made of, for example, an aluminum light metal, a passivation film 3 made of, for example, silicon oxide, and a protective film 5 made of, for example, a polyimide resin are formed on the upper surface of a silicon substrate in a wafer state (hereinafter referred to as a semiconductor wafer 21). The center of the connection pad 2 is exposed through openings 4 and 6 of the passivation film 3 and the protective film 5.

In this case, the thickness of the semiconductor wafer 21 is greater than the thickness of the silicon substrate 1 shown in FIG. 2. In FIG. 3, zones indicated by the sign 22 are dicing streets. The parts of the passivation film 3 and the protective film 5 corresponding to the dicing street 22 and both its sides are removed.

Figure 4:
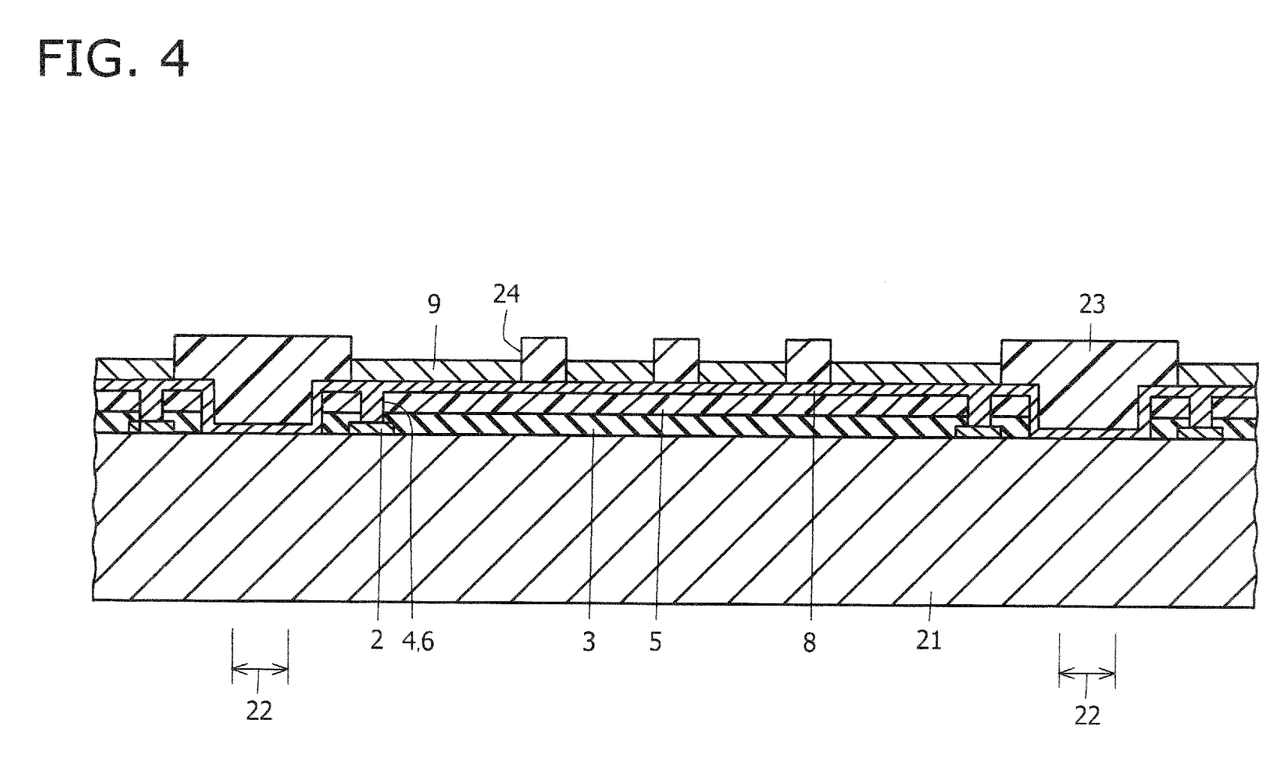
FIG. 4 is a sectional view of a step following FIG. 3.

As shown in FIG. 4, a foundation metal layer 8 is then formed on the upper surface of the first insulating film 5 including the upper surface of the connection pad 2 exposed through the openings 4 and 6 of the passivation film 3 and the first insulating film 5, and on parts of the upper surface of the semiconductor wafer 21 corresponding to the dicing street 22 and both its sides. In this case, the foundation metal layer 8 may only be a copper layer formed by electroless plating, may only be a copper layer formed by sputtering, or may be a copper layer formed by sputtering on a thin layer of, for example, titanium formed by sputtering.

A plating resist film 23 made of a positive liquid resist is then formed and patterned on the upper surface of the foundation metal layer 8. In this case, an opening 24 is formed in a part of the plating resist film 23 corresponding to a region where an upper metal layer 9 is to be formed. Further, electrolytic plating with copper is carried out using the foundation metal layer 8 as a plating current path, thereby forming the upper metal layer 9 on the upper surface of the foundation metal layer 8 within the opening 24 of the plating resist film 23. The plating resist film 23 is then detached.

Figure 5:
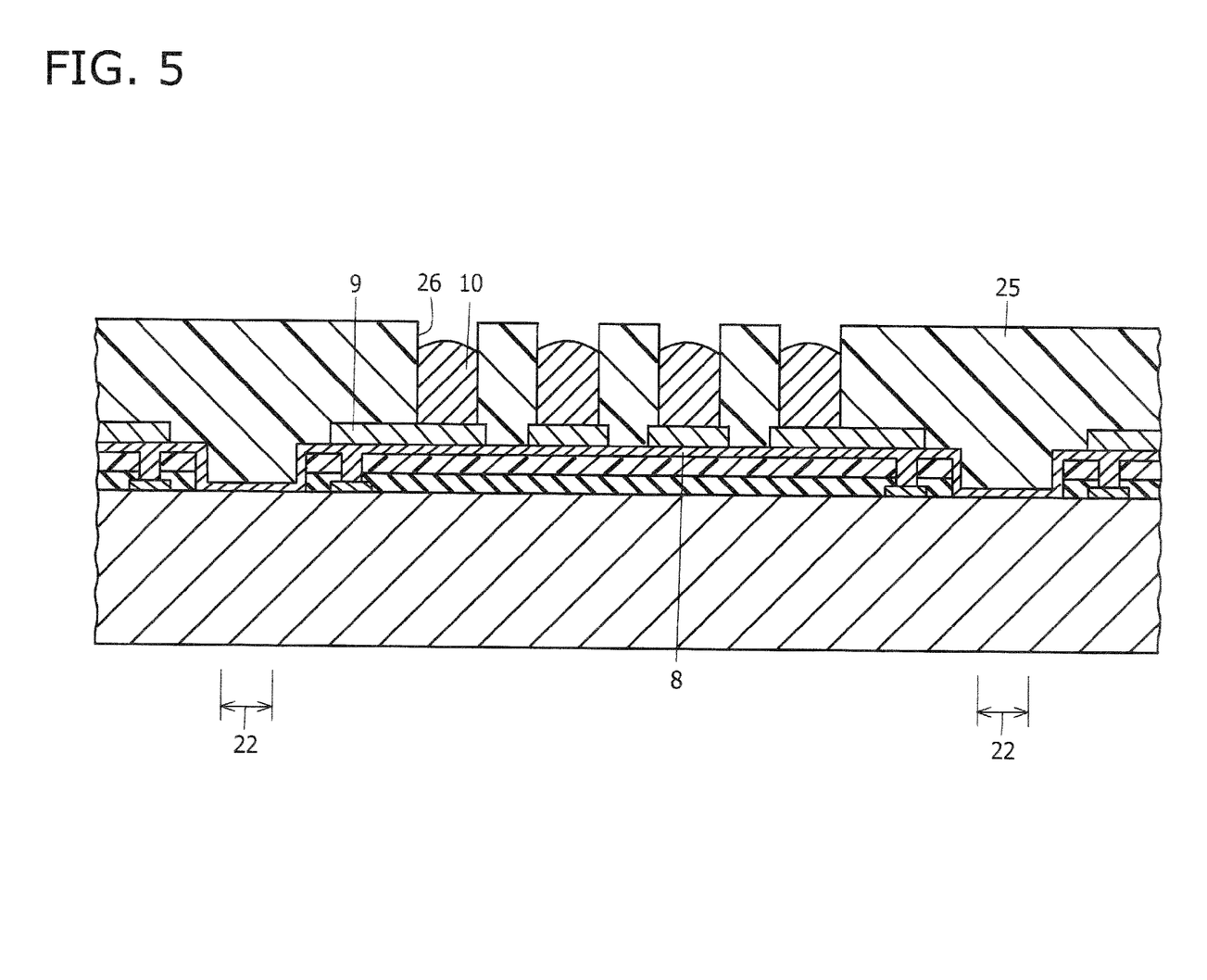
FIG. 5 is a sectional view of a step following FIG. 4.

As shown in FIG. 5, a plating resist film 25 made of a negative dry film resist is then formed and patterned on the upper surface of the foundation metal layer 8 including the upper metal layer 9. In this case, an opening 26 is formed in a part of the plating resist film 25 corresponding to a land (a region where a external connection electrode 10 is to be formed) of the upper metal layer 9.

Electrolytic plating with copper is then carried out using the foundation metal layer 8 as a plating current path. As a result, the external connection electrode 10 is formed on the upper surface of the land of the upper metal layer 9 within the opening 26 in the plating resist film 25. In this case, the upper part of the external connection electrode 10 is not flat and is domed. The height of this external connection electrode 10 is greater than the height of the external connection electrode 10 shown in FIG. 2.

Figure 6:
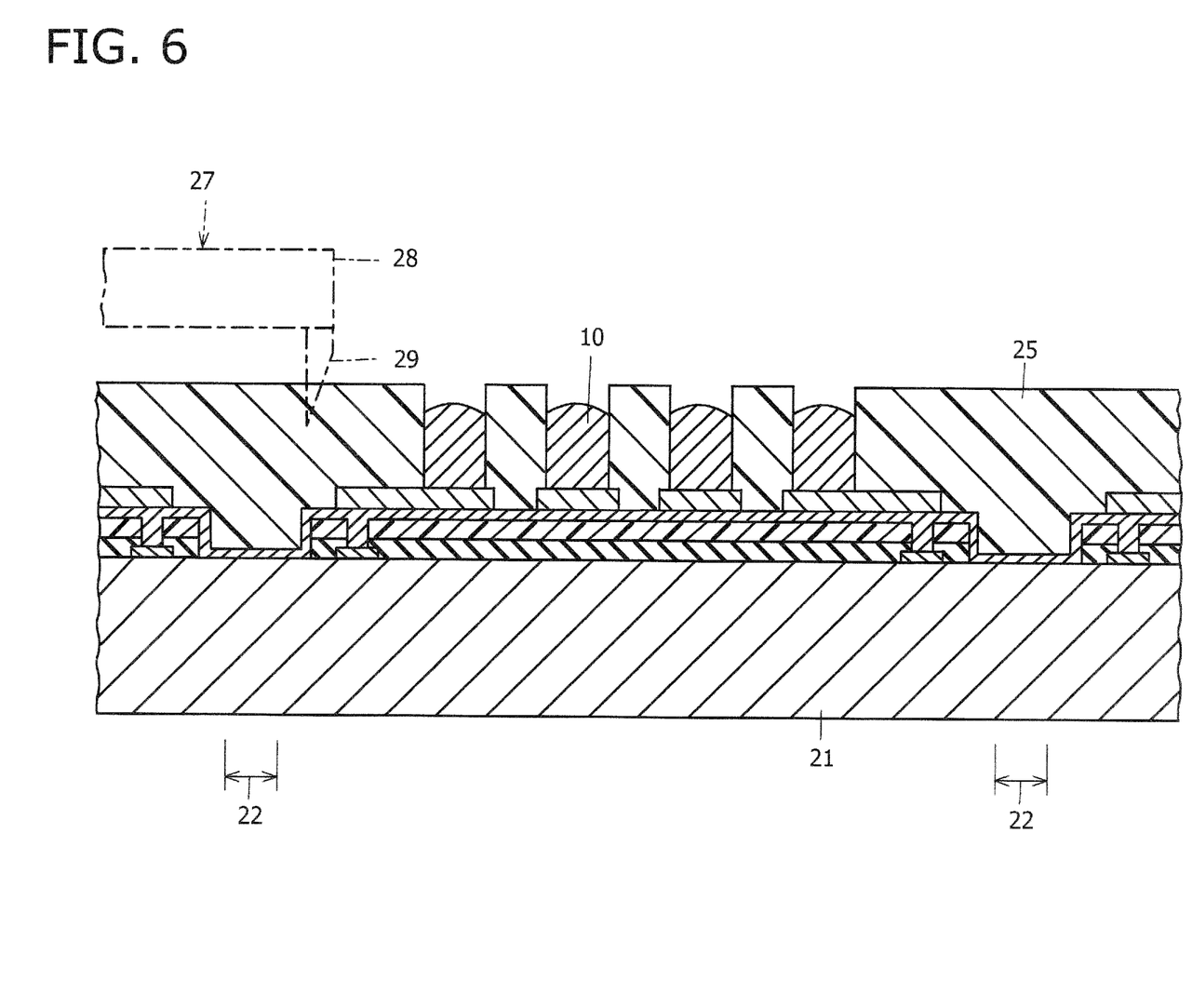
FIG. 6 is a sectional view of a step following FIG. 5.

As shown in FIG. 6, a surface planer 27 is then prepared. This surface planer 27 is fixedly disposed, and has a cutting tool 29 provided in the lower surface of the peripheral part of a rotary disk 28. The cutting tool 29 rotated together with the rotary disk 28 when driven by driving means (not shown).

Figure 7:
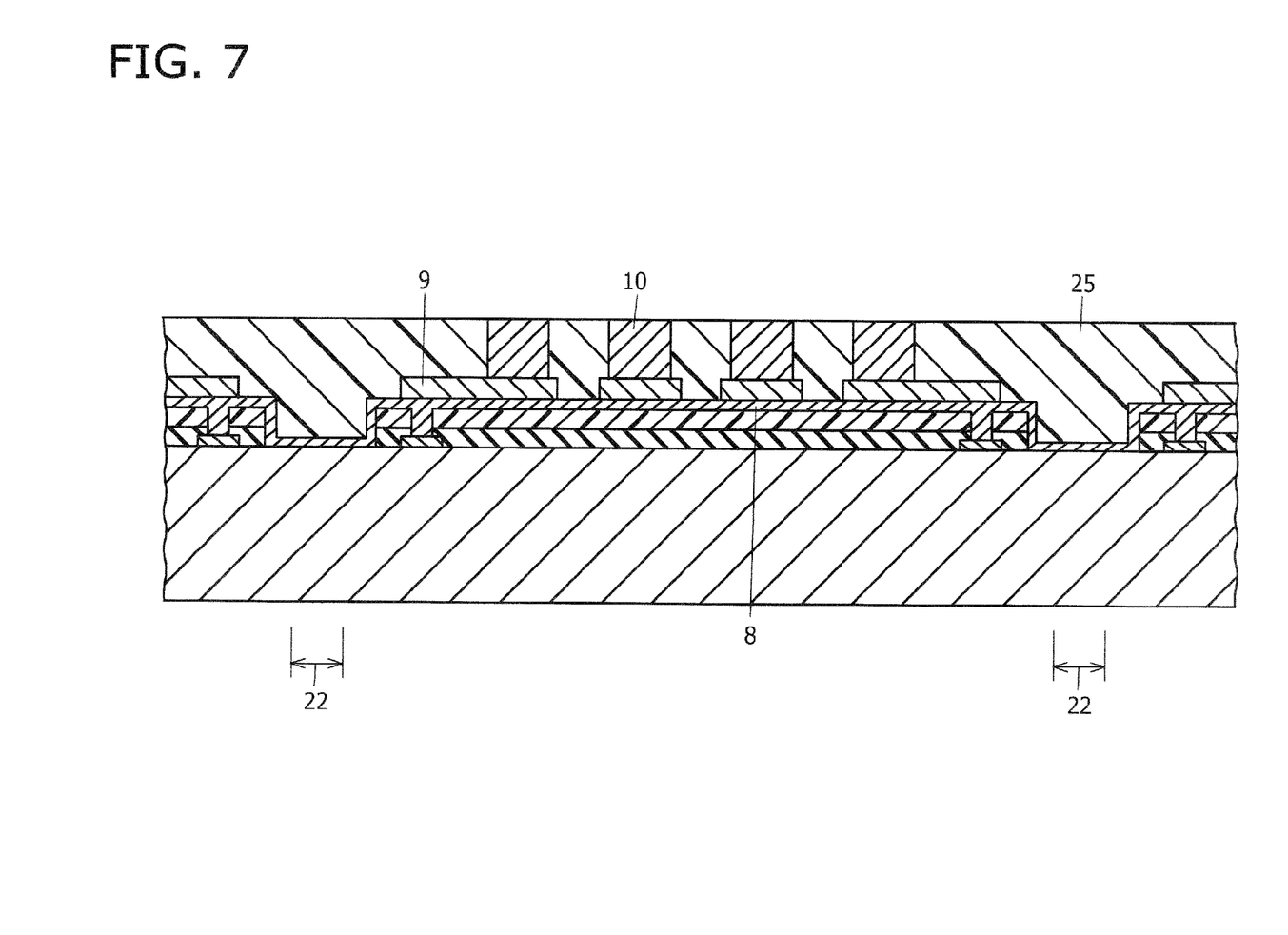
FIG. 7 is a sectional view of a step following FIG. 6.

The point of the cutting tool 29 is then located at a final height position of the external connection electrode 10, and the cutting tool 29 is rotated together with the rotary disk 28. In this condition, if the semiconductor wafer 21 having the external connection electrode 10 and the plating resist film 25 is horizontally moved, the upper parts of all the external connection electrodes 10 and the corresponding upper sides of the plating resist films 25 are cut off by the cutting tool 29 rotated together with the rotary disk 28. Thus, as shown in FIG. 7, the height of the external connection electrodes 10 is adjusted to the final height position, and the upper surfaces of the external connection electrodes 10 are flush with the upper surface of the plating resist film 25. In this way, the external connection electrode including copper, a soft metal such as gold, and the plating resist film 25 can be cut by the surface planer 27, and their surfaces can be smoothed.

In this case, the upper parts of all the external connection electrodes 10 and the corresponding upper sides of the plating resist films 25 are swiftly cut off at a time by the point of the cutting tool 29. Therefore, in contrast to the case where the grind stone is used, no burrs are generated in the upper surface of the external connection electrode 10. Accordingly, there is no need for an after-treatment to remove the burrs by wet etching, and the height of the external connection electrode 10 does not unnecessary decrease and the upper peripheral part of the external connection electrode does not become unnecessarily thin.

The plating resist film 25 is then detached. After the plating resist film 25 is detached, the upper part of the external connection electrode 10 may be cut off by using the surface planer 27. However, if the upper part of the external connection electrode 10 is cut off so that the plating resist film 25 remains as described above, the presence of the plating resist film 25 makes it possible to completely prevent the external connection electrode 10 from collapsing. Moreover, scrapings of the external connection electrode 10 do not stick to the upper metal layer 9, and the scrapings can be removed together when the plating resist film 25 is detached.

Figure 8:
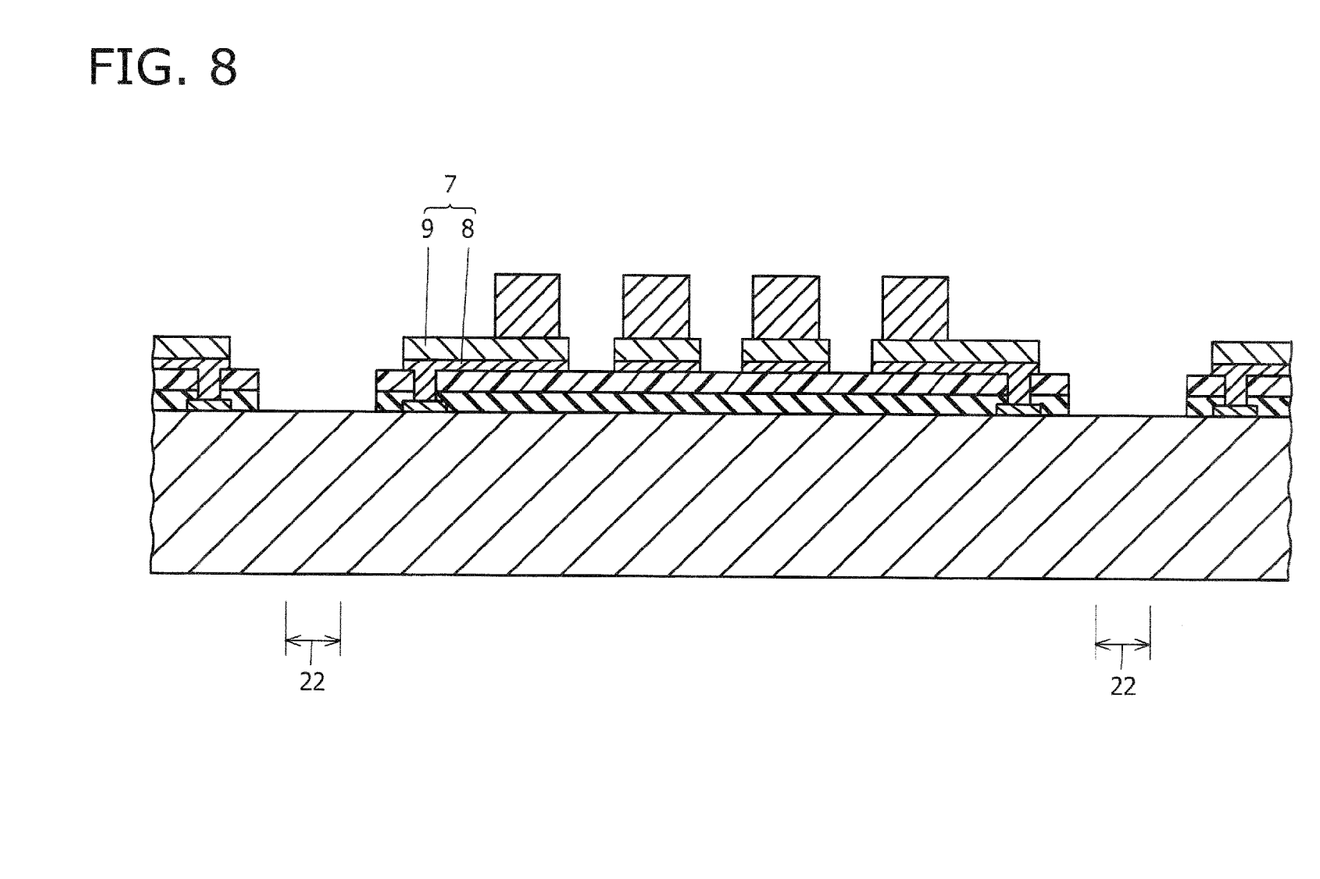
FIG. 8 is a sectional view of a step following FIG. 7.

Using the upper metal layer 9 as a mask, the foundation metal layer 8 located in a part other than a part under the upper metal layer 9 is then etched and removed. Thus, as shown in FIG. 8, the foundation metal layer 8 remains under the upper metal layer 9 alone. In this state, a wiring line 7 having a double-layer structure is formed by the upper metal layer 9 and the foundation metal layer 8 remaining thereunder.

Figure 9:
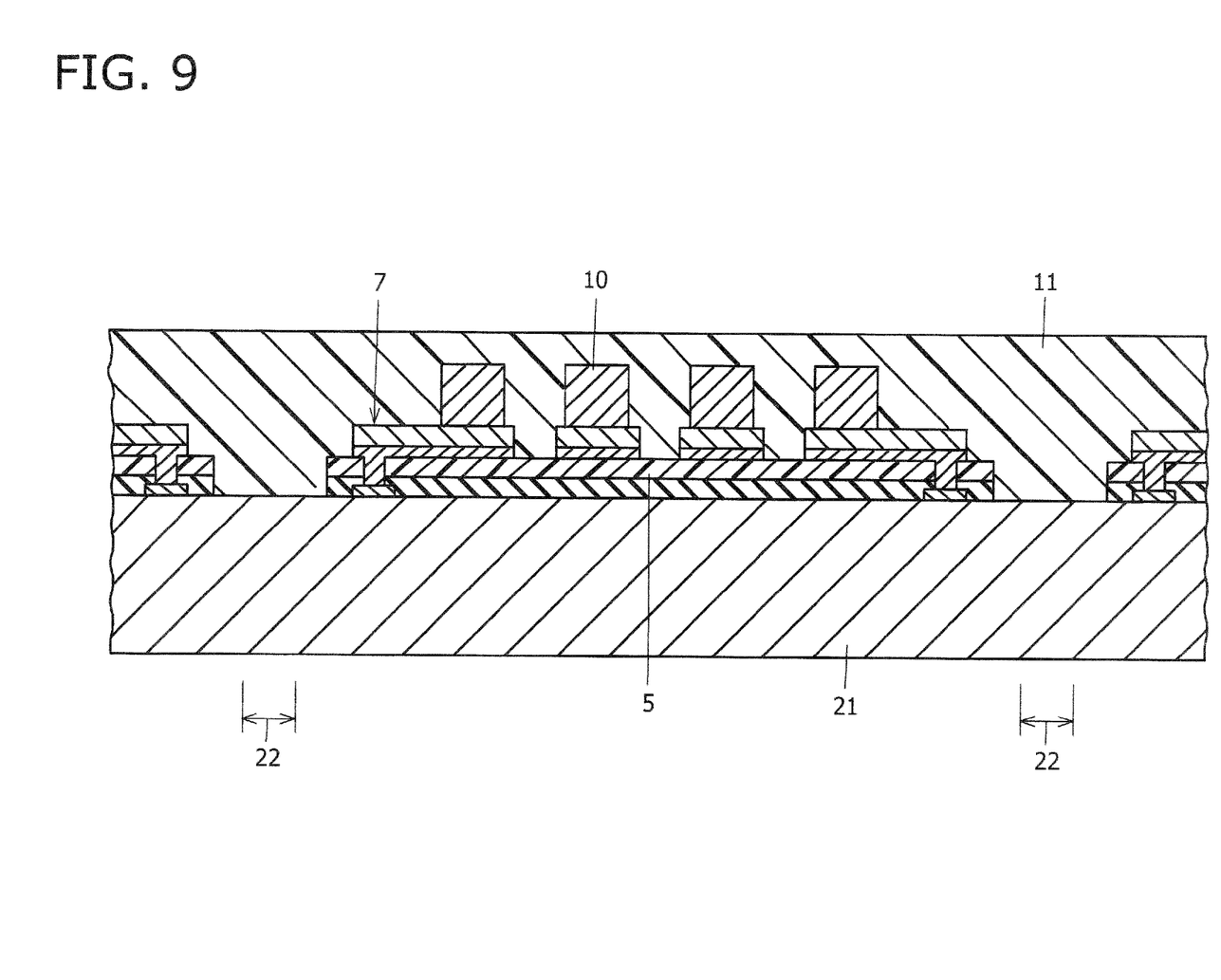
FIG. 9 is a sectional view of a step following FIG. 8.

As shown in FIG. 9, a sealing film 11 made of an epoxy resin containing a silica filler is then formed by a method such as screen printing on the upper surface of the semiconductor wafer 21 corresponding to the dicing street 22 and both its sides and on the upper surface of the protective film 5 including the wiring line 7 and the external connection electrode 10 so that the thickness of the sealing film 11 is slightly greater than the height of the external connection electrode 10. Thus, in this condition, the upper surface of the external connection electrode 10 is covered with the sealing film 11 in the form of a single film.

Figure 10:
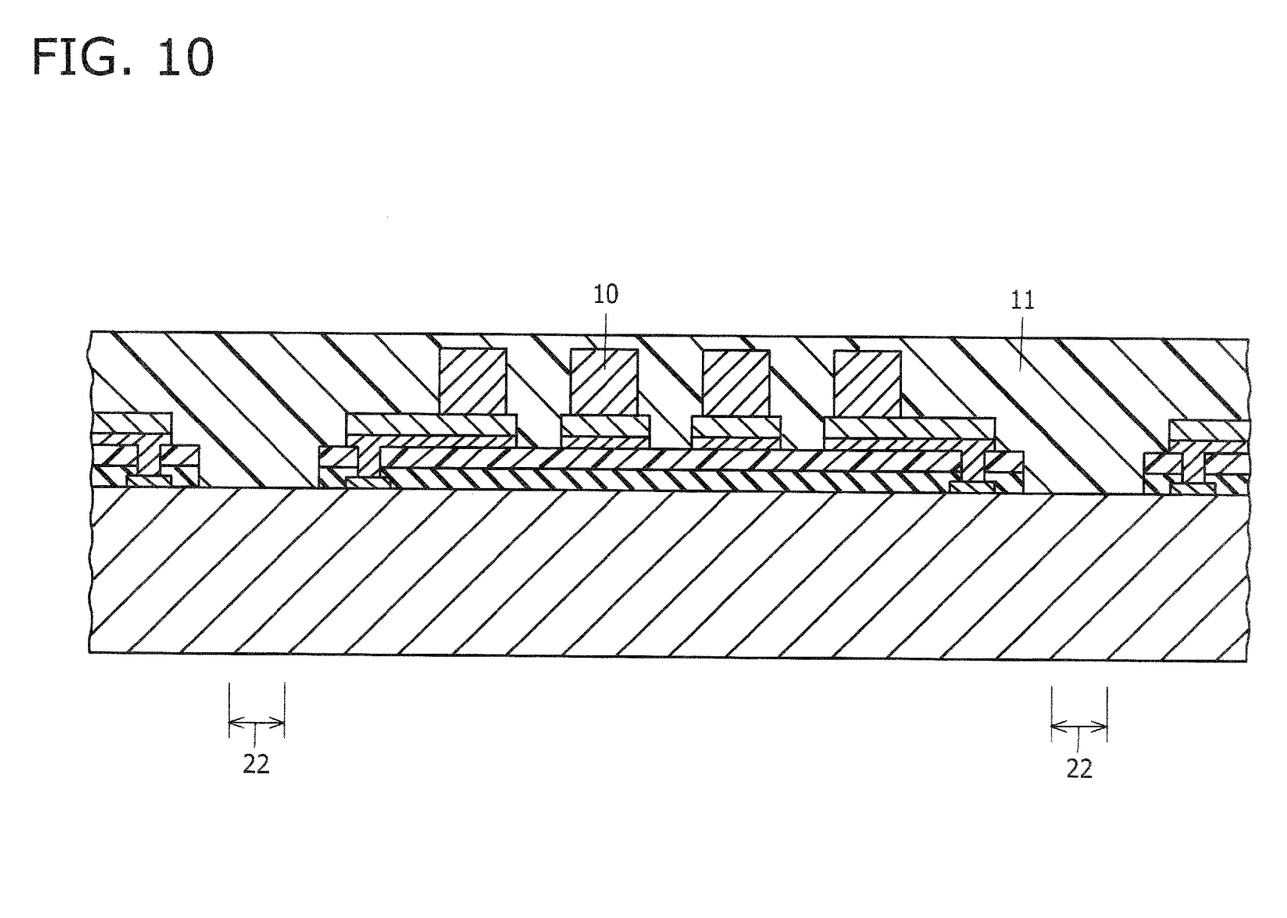
FIG. 10 is a sectional view of a step following FIG. 9.

The upper side of the sealing film 11 is then ground by the grind stone (not shown) so that the sealing film 11 remains 10 μm or less, for example, several μm to 10 μm in thickness on the external connection electrode 10, and the upper surface of the sealing film 11 is planarized. Thus, in this condition, the upper surface of the external connection electrode 10 is covered with the thin sealing film 11. Moreover, the upper part of the external connection electrode 10 is not ground, so that no burrs are generated in the upper surface of the external connection electrode 10.

Figure 11:
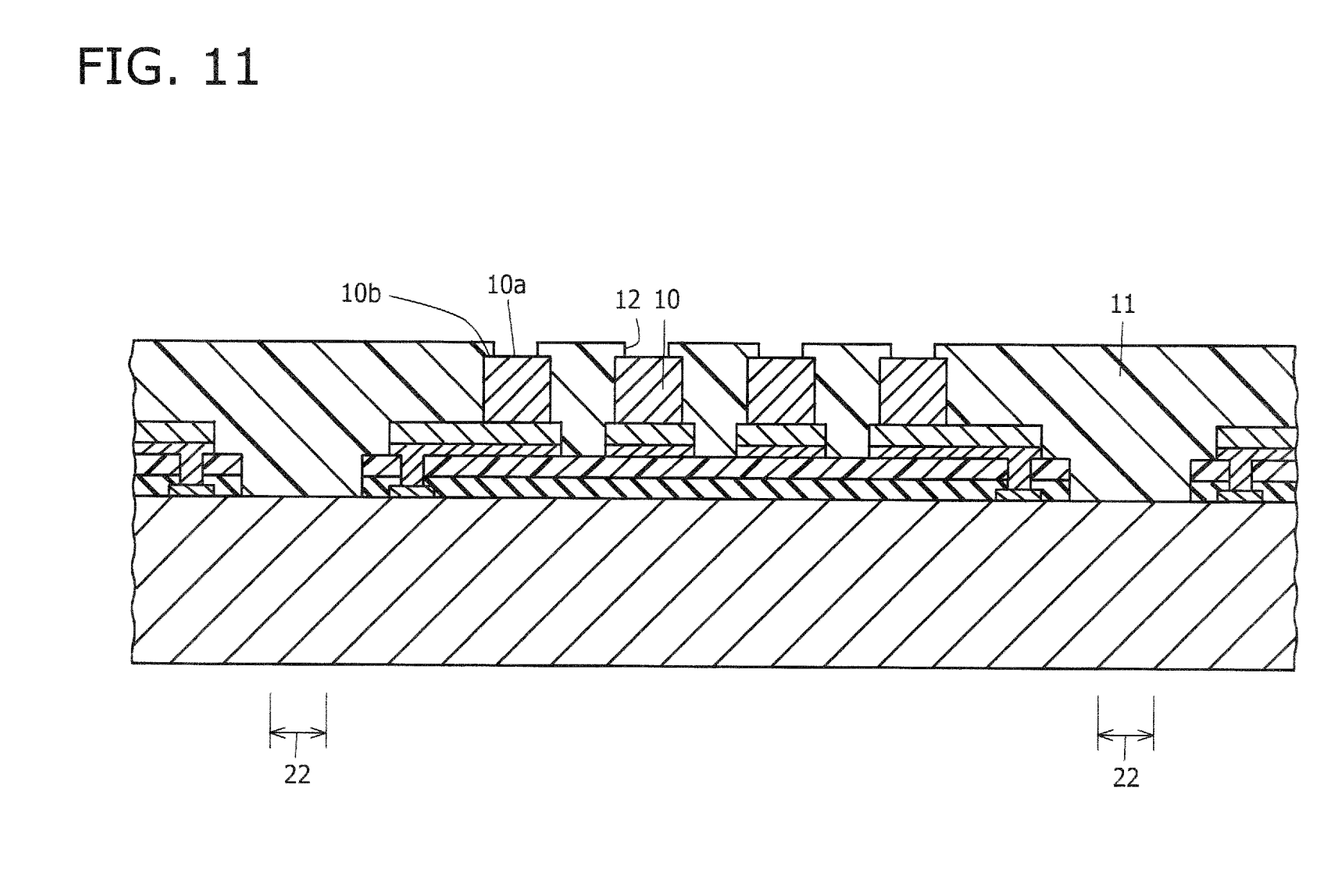
FIG. 11 is a sectional view of a step following FIG. 10.

As shown in FIG. 11, an opening 12 is then formed in a part of the sealing film 11 corresponding to the center of the upper surface of the external connection electrode 10 by laser processing which applies a laser beam such as a $CO_2$ or YAP laser beam. In this case, the opening 12 is formed in the sealing film 11 so that the opening 12 exposes a part 10a of the upper surface of the external connection electrode 10 and so that the sealing film 11 covers a remaining part 10b of the upper surface of the external connection electrode 10. The opening 12 of the sealing film 11 and the upper surface of the external connection electrode 10 are substantially circular. The diameter of the opening 12 is smaller than the diameter of the external connection electrode 10 by 10 μm or less, for example, several μm to 10 μm. Thus, in this condition, the peripheral part of the upper surface of the external connection electrode 10 is covered with the thin sealing film 11, which makes it possible to prevent the external connection electrode 10 and the sealing film 11 from easily detaching from each other.

Figure 12:
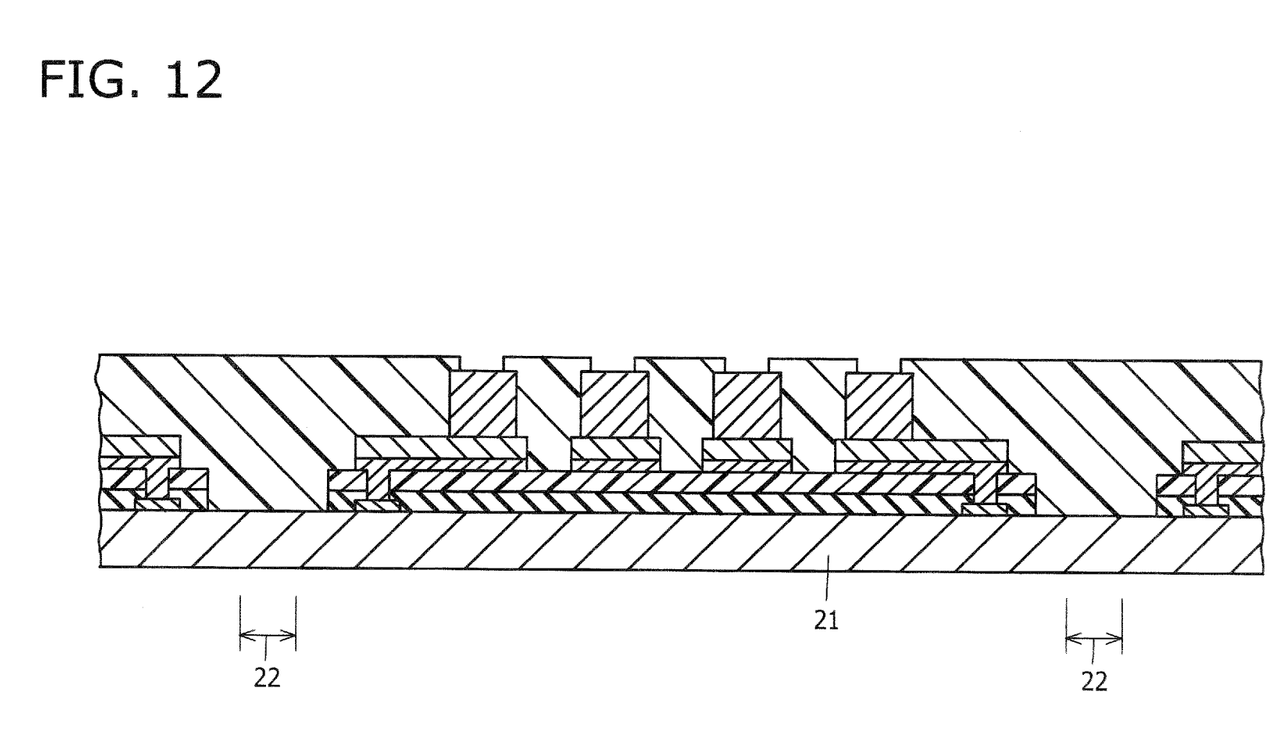
FIG. 12 is a sectional view of a step following FIG. 11.
Figure 13:
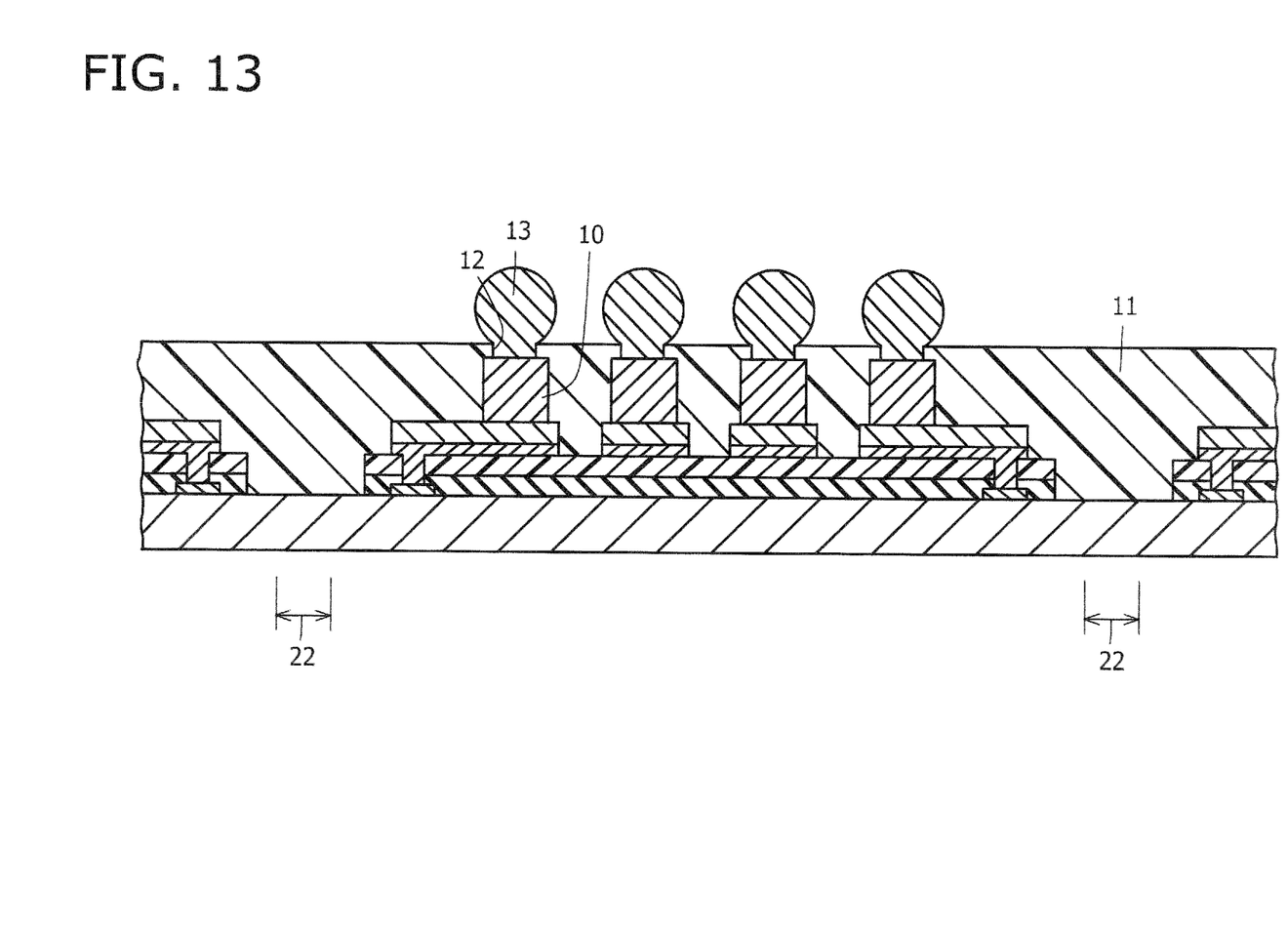
FIG. 13 is a sectional view of a step following FIG. 12.
Figure 14:
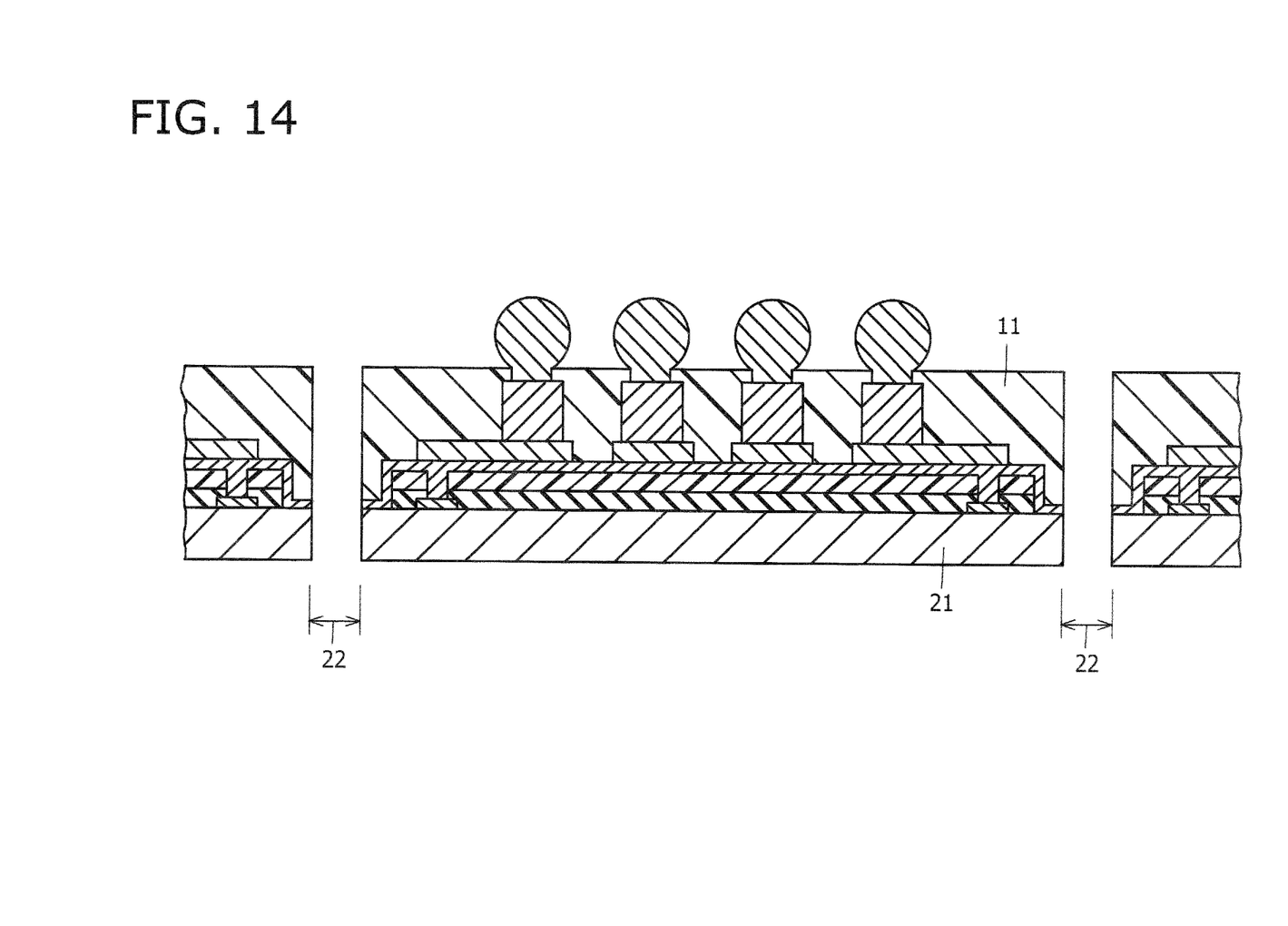
FIG. 14 is a sectional view of a step following FIG. 13.

As shown in FIG. 12, the lower side of the semiconductor wafer 21 is then properly ground to reduce the thickness of the semiconductor wafer 21. Further, as shown in FIG. 13, a solder bump 13 is formed in and above the opening 12 of the sealing film 11 so that this solder bump 13 is connected to the upper surface center of the external connection electrode 10. Further, as shown in FIG. 14, the sealing film 11 and the semiconductor wafer 21 are cut along the dicing streets 22, thereby obtaining the semiconductor devices shown in FIG. 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate having a connection pad;
an external connection electrode provided on the semiconductor substrate to be connected to the connection pad; and
a sealing film provided to cover the external connection electrode,
wherein an opening is provided in the sealing film to expose a center of an upper surface of the external connection electrode, and the sealing film is provided to cover an outer peripheral part of the upper surface of the external connection electrode, and
wherein the opening of the sealing film and the upper surface of the external connection electrode are circular, and a diameter of the opening of the sealing film is smaller than a diameter of the upper surface of the external connection electrode by 10 μm or less.

2. The semiconductor device according to claim 1, wherein the sealing film is in the form of a single film.

3. The semiconductor device according to claim 1, wherein an insulating film is provided on the semiconductor substrate, a wiring line is provided on the insulating film to be connected to the connection pad, and the external connection electrode is provided on a land of the wiring line.

4. The semiconductor device according to claim 1, wherein the upper surface of the sealing film is flat except for the opening.

5. The semiconductor device according to claim 1, wherein a thickness of the sealing film at the outer peripheral part of the upper surface of the external connection electrode is 10 µm or less.

6. The semiconductor device according to claim 1, wherein a solder bump is provided in the opening of the sealing film and on the sealing film so that the solder bump is connected to at least the center of the upper surface of the external connection electrode.

7. A semiconductor device manufacturing method comprising:
   forming a sealing film to cover a peripheral side surface and an upper surface of an external connection electrode which is formed on a semiconductor substrate to be connected to a connection pad of the semiconductor substrate; and
   forming an opening in the sealing film,
   wherein the opening is formed in the sealing film so that the opening exposes a center of an upper surface of the external connection electrode and so that the sealing film covers an outer peripheral part of the upper surface of the external connection electrode, and
   wherein after the formation of the sealing film, an upper side of the sealing film is ground so that a thickness of the sealing film on the external connection electrode is 10 µm or less, before the formation of the opening in the sealing film.

8. The semiconductor device manufacturing method according to claim 7, wherein the sealing film is formed into a single film.

9. The semiconductor device manufacturing method according to claim 7, wherein the opening is formed in the sealing film by laser processing which applies a laser beam.

10. The semiconductor device manufacturing method according to claim 7, wherein a solder bump is formed in the opening of the sealing film and on the sealing film so that the solder bump is connected to at least the center of the upper surface of the external connection electrode.

11. A semiconductor device manufacturing method comprising:
   forming a sealing film to cover a peripheral side surface and an upper surface of an external connection electrode which is formed on a semiconductor substrate to be connected to a connection pad of the semiconductor substrate; and
   forming an opening in the sealing film,
   wherein the opening is formed in the sealing film so that the opening exposes a center of an upper surface of the external connection electrode and so that the sealing film covers an outer peripheral part of the upper surface of the external connection electrode,
   wherein:
      the external connection electrode is formed by electrolytic plating using a plating resist film formed on the semiconductor substrate, and
      the plating resist film on the semiconductor substrate is detached, and
   wherein after the formation of the external connection electrode, an upper part of the external connection electrode and an upper side of the plating resist film are cut off with the plating resist film remaining on the semiconductor substrate, before the detachment of the plating resist film.

12. The semiconductor device manufacturing method according to claim 11, wherein:
   after the upper part of the external connection electrode is cut off by a surface planer, the sealing film is formed to cover the entire upper surface of the external connection electrode, and
   before the opening is formed in the sealing film, the sealing film is formed so that the sealing film remains on the entire upper surface of the external connection electrode.

13. The semiconductor device manufacturing method according to claim 11, wherein the upper part of the external connection electrode and the upper side of the plating resist film are cut by a surface planer and simultaneously removed.

14. A semiconductor device manufacturing method comprising:
   forming a sealing film to cover a peripheral side surface and an upper surface of an external connection electrode which is formed on a semiconductor substrate to be connected to a connection pad of the semiconductor substrate; and
   forming an opening in the sealing film,
   wherein the opening is formed in the sealing film so that the opening exposes a center of an upper surface of the external connection electrode and so that the sealing film covers an outer peripheral part of the upper surface of the external connection electrode,
   wherein the opening of the sealing film and the upper surface of the external connection electrode are circular, and the opening is formed in the sealing film so that a diameter of the opening of the sealing film is smaller than a diameter of the external connection electrode by 10 µm or less.

* * * * *